(12) United States Patent
Kim et al.

(10) Patent No.: US 12,557,642 B2
(45) Date of Patent: Feb. 17, 2026

(54) SEMICONDUCTOR DEVICE AND METHOD FOR FABRICATING THE SAME

(71) Applicant: Samsung Electronics Co., Ltd., Suwon-si (KR)

(72) Inventors: Seon Bae Kim, Suwon-si (KR); Seo Woo Nam, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 189 days.

(21) Appl. No.: 18/373,392

(22) Filed: Sep. 27, 2023

(65) Prior Publication Data

US 2024/0021520 A1    Jan. 18, 2024

Related U.S. Application Data

(63) Continuation of application No. 17/476,985, filed on Sep. 16, 2021, now Pat. No. 11,837,548.

(30) Foreign Application Priority Data

Feb. 17, 2021    (KR) .................. 10-2021-0020867

(51) Int. Cl.

| | | |
|---|---|---|
| *H01L 23/535* | (2006.01) | |
| *H01L 21/3213* | (2006.01) | |
| *H01L 21/768* | (2006.01) | |
| *H01L 23/522* | (2006.01) | |

(Continued)

(52) U.S. Cl.
CPC .... *H01L 23/53295* (2013.01); *H01L 21/3213* (2013.01); *H01L 21/76877* (2013.01); *H01L 23/5226* (2013.01); *H01L 23/5283* (2013.01)

(58) Field of Classification Search
CPC .......... H01L 23/53295; H01L 21/3213; H01L 21/76877; H01L 23/5226; H01L 23/5283; H01L 21/76885; H01L 23/5222; H01L 21/7682; H01L 21/76897; H01L 21/76816; H01L 23/528
See application file for complete search history.

(56) References Cited

U.S. PATENT DOCUMENTS

| | | | |
|---|---|---|---|
| 5,614,765 A | 3/1997 | Avanzino et al. | |
| 6,576,509 B1 | 6/2003 | Toyokawa et al. | |
| 7,719,117 B2 | 5/2010 | Ishida et al. | |

(Continued)

FOREIGN PATENT DOCUMENTS

| | | |
|---|---|---|
| JP | H11163523 A | 6/1999 |
| JP | 2000208615 A | 7/2000 |

(Continued)

*Primary Examiner* — Samuel Park
(74) *Attorney, Agent, or Firm* — Muir Patent Law, PLLC

(57) ABSTRACT

A semiconductor device includes a substrate, a first interlayer insulating layer disposed on the substrate, a first trench formed inside the first interlayer insulating layer, a contact plug disposed inside the first trench, a first wiring pattern disposed on the contact plug, a second wiring pattern which is disposed on the first interlayer insulating layer and spaced apart from the first wiring pattern in a horizontal direction, a second interlayer insulating layer which is disposed on the first interlayer insulating layer and surrounds each of side walls of the first wiring pattern and each of side walls of the second wiring pattern, and a first air gap formed on the contact plug inside the first trench.

13 Claims, 21 Drawing Sheets

(51) Int. Cl.
    *H01L 23/528*    (2006.01)
    *H01L 23/532*    (2006.01)

(56) References Cited

U.S. PATENT DOCUMENTS

| | | |
|---|---|---|
| 8,404,593 B2 | 3/2013 | Hong et al. |
| 8,471,318 B2 | 6/2013 | Nam |
| 9,799,552 B2 | 10/2017 | Gates et al. |
| 10,777,456 B1 | 9/2020 | Aizawa et al. |
| 2006/0073695 A1 | 4/2006 | Filippi et al. |
| 2009/0072409 A1 | 3/2009 | Nitta et al. |
| 2012/0153480 A1* | 6/2012 | Pfuetzner .......... H01L 21/76843 |
| | | 257/E23.161 |
| 2014/0001625 A1 | 1/2014 | Han et al. |
| 2014/0035147 A1 | 2/2014 | Lee |
| 2014/0225278 A1* | 8/2014 | Vannier ............. H01L 23/53295 |
| | | 257/774 |
| 2016/0013133 A1 | 1/2016 | Gu et al. |
| 2017/0025354 A1 | 1/2017 | Watanabe et al. |
| 2018/0211995 A1* | 7/2018 | Bak ........................ H10N 50/01 |
| 2018/0261544 A1 | 9/2018 | Kim et al. |
| 2019/0221475 A1 | 7/2019 | Hong et al. |
| 2020/0219768 A1 | 7/2020 | Parikh et al. |
| 2020/0303254 A1 | 9/2020 | Parikh |
| 2021/0193799 A1 | 6/2021 | Liang et al. |
| 2021/0249299 A1 | 8/2021 | Lee et al. |
| 2021/0391261 A1 | 12/2021 | Liao et al. |

FOREIGN PATENT DOCUMENTS

| | | |
|---|---|---|
| KR | 20090106159 A | 10/2009 |
| KR | 101288424 B1 | 7/2013 |

\* cited by examiner

SEMICONDUCTOR DEVICE AND METHOD FOR FABRICATING THE SAME

CROSS-REFERENCE TO RELATED APPLICATIONS

This application is a Continuation of U.S. patent application Ser. No. 17/476,985 filed on Sep. 16, 2021, which claims priority under 35 U.S.C. § 119 to Korean Patent Application No. 10-2021-0020867, filed on Feb. 17, 2021, in the Korean Intellectual Property Office, the disclosure of each of which is incorporated herein in its entirety by reference.

BACKGROUND

1. Technical Field

The present disclosure relates to a semiconductor device and a method for fabricating the same.

2. Description of the Related Art

Semiconductor elements are spotlighted as important factors in the electronics industry due to characteristics such as miniaturization, multi-functionality and/or low fabricating cost. The semiconductor elements may be classified into a semiconductor storage element that stores logical data, a semiconductor logical element that performs a computing process of logical data, a hybrid semiconductor element including a storage element and a logical element, and the like.

With the recent increase in speed and low power consumption of the electronic devices, the semiconductor elements built therein are also required to have a high operating speed and/or a low operating voltage. In order to satisfy these required characteristics, semiconductor elements are more highly integrated. The deeper the high integration of semiconductor elements is, the lower the reliability of semiconductor elements may be. However, as the electronics industry develops to a high degree, the demand for high reliability of the semiconductor elements increases. Therefore, much research is being conducted to improve the reliability of the semiconductor elements.

SUMMARY

Aspects of the present disclosure provide a semiconductor device in which reliability is ensured by forming a wiring pattern on a contact plug in which a part of an upper part is etched to secure an isolation margin with an adjacent wiring pattern, and a method for fabricating the semiconductor device.

According to an exemplary embodiment of the present disclosure, there is provided a semiconductor device, comprising a substrate, a first interlayer insulating layer disposed on the substrate, a first trench formed inside the first interlayer insulating layer, a contact plug disposed inside the first trench, a first wiring pattern disposed on the contact plug, a second wiring pattern which is disposed on the first interlayer insulating layer and spaced apart from the first wiring pattern in a horizontal direction, a second interlayer insulating layer which is disposed on the first interlayer insulating layer and surrounds each of side walls of the first wiring pattern and each of side walls of the second wiring pattern, and a first air gap formed on the contact plug inside the first trench.

According to an exemplary embodiment of the present disclosure, there is provided a semiconductor device, comprising a substrate, a first interlayer insulating layer disposed on the substrate, a first trench formed inside the first interlayer insulating layer, a contact plug disposed inside the first trench, a first wiring pattern disposed on the contact plug, a second wiring pattern which is disposed on the first interlayer insulating layer and spaced apart from the first wiring pattern in a horizontal direction, a second interlayer insulating layer which is disposed on the first interlayer insulating layer and surrounds each of side walls of the first wiring pattern and each of side walls of the second wiring pattern, and a first air gap and a second air gap which are formed on the contact plug inside the first trench, and spaced apart from each other in the horizontal direction. A height from an upper surface of the contact plug to an upper surface of the first interlayer insulating layer is greater than a pitch between the first trench and the second wiring pattern in the horizontal direction. A width of the first wiring pattern in the horizontal direction increases toward the contact plug.

According to an exemplary embodiment of the present disclosure, there is provided a method for fabricating a semiconductor device, comprising forming a first interlayer insulating layer including a trench on a substrate, forming a contact plug inside the trench, forming a first wiring pattern on the contact plug, forming a second interlayer insulating layer which surrounds side walls of the first wiring pattern on the first interlayer insulating layer, forming an air gap between the contact plug and the second interlayer insulating layer inside the trench in a vertical direction, and forming a third interlayer insulating layer on the second interlayer insulating layer. An upper surface of the air gap is formed lower than an upper surface of the first interlayer insulating layer.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Hereinafter, a semiconductor device according to some embodiments of the present disclosure will be described referring to FIGS. 1 and 2.

Figure 1:
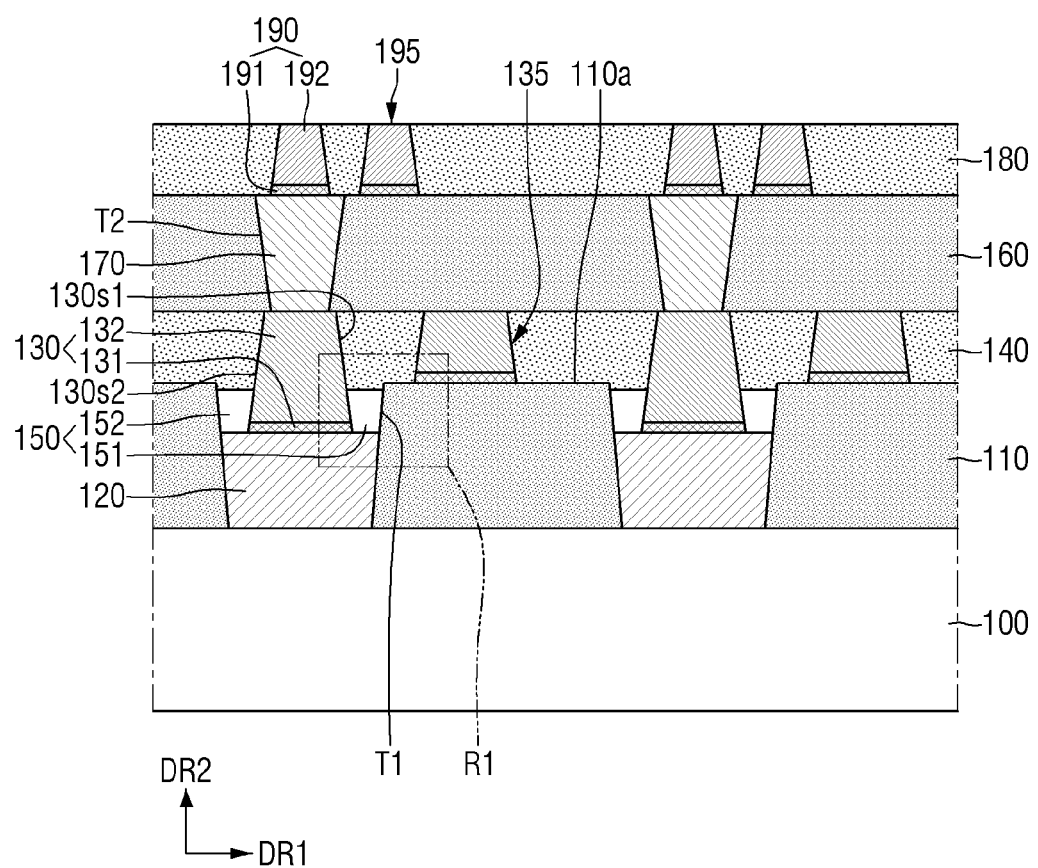
FIG. 1 is a diagram for explaining a semiconductor device according to some embodiments of the present disclosure.

FIG. 1 is a diagram for explaining a semiconductor device according to some embodiments of the present disclosure. FIG. 2 is an enlarged view of a region R1 of FIG. 1.

Figure 2:
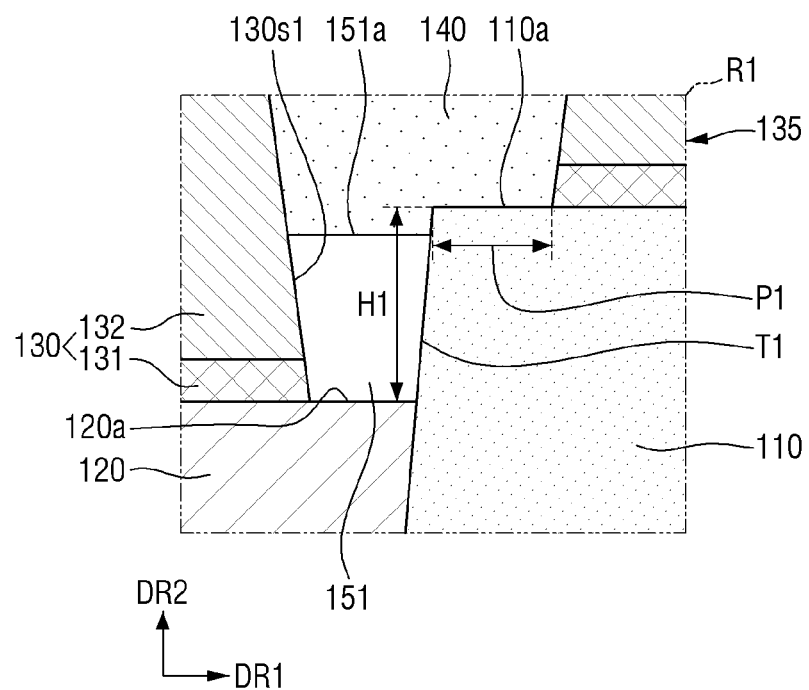
FIG. 2 is an enlarged view of a region R1 of FIG. 1.

Referring to FIGS. 1 and 2, the semiconductor device according to some embodiments of the present disclosure includes a substrate 100, a first interlayer insulating layer 110, a contact plug 120, a first wiring pattern 130, a second wiring pattern 135, a second interlayer insulating layer 140, an air gap 150, a third interlayer insulating layer 160, a via 170, a fourth interlayer insulating layer 180, a third wiring pattern 190, and a fourth wiring pattern 195.

Although the substrate 100 may have a structure in which a base substrate and an epitaxial layer are stacked, the present disclosure is not limited thereto. The substrate 100 may be a silicon substrate, a gallium arsenide substrate, a silicon germanium substrate, a ceramic substrate, a quartz substrate, a glass substrate for a display, or the like, or may be an SOI (Semiconductor On Insulator) substrate.

Also, although it is not shown, the substrate 100 may include a conductive pattern. Although the conductive pattern may be a metal wiring, a contact, etc., and may be a gate electrode of a transistor, a source/drain of the transistor, a diode, or the like, the present disclosure is not limited thereto.

In some embodiments, the substrate 100 may include a fin-type transistor (FinFET) including a channel region of a fin-type pattern shape, a transistor including a nanowire or a nanosheet (MBCFET™ (Multi-Bridge Channel Field Effect Transistor)), a tunneling transistor (tunneling FET), a planar transistor, a bipolar junction transistor or a laterally diffused metal oxide semiconductor (LDMOS) transistor. Moreover, in some other embodiments, the substrate 100 may include a NCFET (Negative Capacitance Field Effect Transistor) or a VFET (Vertical Field-Effect Transistor).

The first interlayer insulating layer 110 may be disposed on the substrate 100. The first interlayer insulating layer 110 may include, for example, at least one of silicon oxide, silicon nitride, silicon oxynitride, and a low dielectric constant material. Although the low dielectric constant material may include, for example, FOX (Flowable Oxide), TOSZ (Tonen SilaZen), USG (Undoped Silica Glass), BSG (Borosilica Glass), PSG (PhosphoSilaca Glass), BPSG (Boro-PhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or a combination thereof, the present disclosure is not limited thereto.

A first trench T1 may be formed inside the first interlayer insulating layer 110. For example, the first trench T1 may penetrate the first interlayer insulating layer 110 in a vertical direction DR2.

The contact plug 120 may be disposed inside the first trench T1. Side walls of the contact plug 120 may be surrounded by the first interlayer insulating layer 110. For example, the contact plug 120 may be electrically connected to a conductive pattern disposed inside the substrate 100.

Although FIG. 1 shows that the contact plug 120 is formed of a single film, this is only for convenience of explanation, and the present disclosure is not limited thereto. For example, the contact plug 120 may be formed of two or more films. In this case, the contact plug 120 may include a barrier layer disposed along the side walls and a bottom surface of the first trench T1, and a filling layer disposed on the barrier layer.

The barrier layer of the contact plug 120 may include, for example, at least one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN) and combinations thereof. The filling layer of the contact plug 120 may include, for example, at least one of copper (Cu), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), molybdenum (Mo), Ruthenium (Ru) and combinations thereof. However, the present disclosure is not limited thereto.

An upper surface 120*a* of the contact plug 120 may be formed to be lower than an upper surface 110*a* of the first interlayer insulating layer 110. For example, at least apart of the first interlayer insulating layer 110 may be exposed to the first trench T1 on the upper surface 120*a* of the contact plug 120.

The first wiring pattern 130 may be disposed on the upper surface 120*a* of the contact plug 120. The first wiring pattern 130 may be in contact with the contact plug 120. At least a part of the first wiring pattern 130 may be disposed inside the first trench T1.

A side wall of the first wiring pattern 130 may have an inclined profile. For example, a width of the first wiring pattern 130 in a horizontal direction DR1 may increase toward the contact plug 120. After the first wiring pattern 130 is formed through a patterning process, the second interlayer insulating layer 140 may be formed. Accordingly, the inclined profile of the side wall of the first wiring pattern 130 may be formed as described above.

Although FIG. 1 shows that the width of the first wiring pattern 130 in the horizontal direction DR1 increases toward the contact plug 120, the present disclosure is not limited thereto. In some other embodiments, the width of the first wiring pattern 130 in the horizontal direction DR1 may decrease toward the contact plug 120.

The first wiring pattern 130 may include a first barrier layer 131 and a first wiring layer 132. The first barrier layer 131 may form a lower surface of the first wiring pattern 130. The first barrier layer 131 may be in contact with the upper surface 120*a* of the contact plug 120. For example, the first barrier layer 131 may be conformally formed on the upper surface 120a of the contact plug 120.

The first barrier layer 131 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN) and combinations thereof. However, the present disclosure is not limited thereto.

The first wiring layer 132 may be disposed on the first barrier layer 131. The first wiring layer 132 may include, for example, at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al) or zirconium (Zr). However, the present disclosure is not limited thereto.

The second wiring pattern 135 may be disposed on the upper surface 110a of the first interlayer insulating layer 110. The second wiring pattern 135 may be spaced apart from the first wiring pattern 130 in the horizontal direction DR1. For example, the second wiring pattern 135 may be electrically connected to a conductive pattern disposed inside the substrate 100.

A side wall of the second wiring pattern 135 may have an inclined profile similar to the side wall of the first wiring pattern 130. For example, a width of the second wiring pattern 135 in the horizontal direction DR1 may increase toward the first interlayer insulating layer 110. After the second wiring pattern 135 is formed through the patterning process, the second interlayer insulating layer 140 may be formed. Accordingly, the inclined profile of the side wall of the second wiring pattern 135 may be formed as described above.

Although FIG. 1 shows that the width of the second wiring pattern 135 in the horizontal direction DR1 increases toward the first interlayer insulating layer 110, the present disclosure is not limited thereto. In some other embodiments, the width of the second wiring pattern 135 in the horizontal direction DR1 may decrease toward the first interlayer insulating layer 110.

The second wiring pattern 135 may include a first barrier layer and a first wiring layer. The first barrier layer of the second wiring pattern 135 may form a lower surface of the second wiring pattern 135. The first barrier layer of the second wiring pattern 135 may be in contact with the upper surface 110a of the first interlayer insulating layer 110. For example, the first barrier layer of the second wiring pattern 135 may be conformally formed on the upper surface 110a of the first interlayer insulating layer 110.

In example embodiments, materials formed of the first barrier layer and the first wiring layer of the second wiring pattern 135 may be the same as the materials formed of the first barrier layer 131 and the first wiring layer 132 of the first wiring pattern 130 as described above.

For example, the second wiring pattern 135 may be spaced apart from the first trench T1 in the horizontal direction DR1 by a first pitch P1. A first height H1 in the vertical direction DR2 from the upper surface 120a of the contact plug 120 to the upper surface 110a of the first interlayer insulating layer 110 may be greater than the first pitch P1 between the first trench T1 and the second wiring pattern 135 in the horizontal direction DR1.

The second interlayer insulating layer 140 may be disposed on the first interlayer insulating layer 110. The second interlayer insulating layer 140 may surround each of a part of the side wall of the first wiring pattern 130 and the side wall of the second wiring pattern 135. For example, the second interlayer insulating layer 140 may surround a part of both side walls of the first wiring pattern 130 and both side walls of the second wiring pattern 135.

An upper surface of the second interlayer insulating layer 140 may be formed on the same plane as each of an upper surface of the first wiring pattern 130 and an upper surface of the second wiring pattern 135. The second interlayer insulating layer 140 may include, for example, at least one of silicon oxide, silicon nitride, silicon oxynitride and a low dielectric constant material.

The air gap 150 may be formed inside the first trench T1 on the upper surface 120a of the contact plug 120. The air gap 150 may be formed on at least one of the side walls of the first wiring pattern 130, between the upper surface 120a of the contact plug 120 and the second interlayer insulating layer 140. The term "air" as discussed herein, may refer to atmospheric air, or other gases that may be present during the manufacturing process. It should be appreciated that an "air gap" may comprise a gap having air or other gases (e.g., such as those present during manufacturing) or may comprise a gap forming a vacuum therein.

For example, the air gap 150 may include a first air gap 151 and a second air gap 152. The first air gap 151 may be spaced apart from the second air gap 152 in the horizontal direction DR1. The first air gap 151 may be formed on a first side wall 130s1 of the first wiring pattern 130. The second air gap 152 may be formed on a second side wall 130s2 of the first wiring pattern 130 opposite to the first side wall 130s1 of the first wiring pattern 130. For example, at least a part of the first wiring pattern 130 may be disposed between the first air gap 151 and the second air gap 152.

The first air gap 151 may be an empty space that is surrounded by the upper surface 120a of the contact plug 120, the first interlayer insulating layer 110, the first side wall 130s1 of the first wiring pattern 130, and the second interlayer insulating layer 140. Further, the second air gap 152 may be an empty space that is surrounded by the upper surface 120a of the contact plug 120, the first interlayer insulating layer 110, the second side wall 130s2 of the first wiring pattern 130, and the second interlayer insulating layer 140.

An upper surface of the air gap 150 may be formed to be lower than the upper surface 110a of the first interlayer insulating layer 110. For example, an upper surface 151a of the first air gap 151 may be formed to be lower than the upper surface 110a of the first interlayer insulating layer 110. Further, an upper surface of the second air gap 152 may be formed to be lower than the upper surface 110a of the first interlayer insulating layer 110.

The third interlayer insulating layer 160 may be disposed on the second interlayer insulating layer 140. The third interlayer insulating layer 160 may cover each of the upper surface of the first wiring pattern 130 and the upper surface of the second wiring pattern 135. The third interlayer insulating layer 160 may include, for example, at least one of silicon oxide, silicon nitride, silicon oxynitride, and a low dielectric constant material.

A second trench T2 may be formed inside the third interlayer insulating layer 160. For example, the second trench T2 may penetrate the third interlayer insulating layer 160 in the vertical direction DR2.

The via 170 may be disposed inside the second trench T2. The side walls of the via 170 may be surrounded by the third interlayer insulating layer 160. For example, the via 170 may be in contact with the first wiring pattern 130.

Although FIG. 1 shows that the via 170 is formed of a single film, this is only for convenience of explanation, and the present disclosure is not limited thereto. For example, via 170 may be formed of two or more films. In this case, the via 170 may include a via barrier layer disposed along the side wall and bottom surface of the second trench T2, and a via filling layer disposed on the via barrier layer.

The via barrier layer may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN) and combinations thereof. The via filling layer may include, for example, at least one of copper (Cu), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), molybdenum (Mo), Ruthenium (Ru) and combinations thereof. However, the present disclosure is not limited thereto.

For example, an upper surface of the via 170 may be formed on the same plane as an upper surface of the third interlayer insulating layer 160. However, the present disclosure is not limited thereto.

The third wiring pattern 190 may be disposed on the upper surface of the via 170. The third wiring pattern 190 may be in contact with the via 170. The third wiring pattern 190 may be electrically connected to the conductive pattern disposed inside the substrate 100 through the via 170, the first wiring pattern 130 and the contact plug 120.

Although FIG. 1 shows that the width of the third wiring pattern 190 in the horizontal direction DR1 increases toward the via 170, the present disclosure is not limited thereto. In some other embodiments, the width of the third wiring pattern 190 in the horizontal direction DR1 may decrease toward the via 170.

The third wiring pattern 190 may include a second barrier layer 191 and a second wiring layer 192. The second barrier layer 191 may form a lower surface of the third wiring pattern 190. The second barrier layer 191 may be in contact with the upper surface of the via 170. For example, the second barrier layer 191 may be conformally formed on the upper surface of the via 170. However, the present disclosure is not limited thereto.

The second barrier layer 191 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN) and combinations thereof. However, the present disclosure is not limited thereto.

The second wiring layer 192 may be disposed on the second barrier layer 191. The second wiring layer 192 may include, for example, at least one of copper (Cu), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), molybdenum (Mo), Ruthenium (Ru) and combinations thereof. However, the present disclosure is not limited thereto.

The fourth wiring pattern 195 may be disposed on the upper surface of the third interlayer insulating layer 160. The fourth wiring pattern 195 may be spaced apart from the third wiring pattern 190 in the horizontal direction DR1.

Although FIG. 1 shows that the width of the fourth wiring pattern 195 in the horizontal direction DR1 increases toward the third interlayer insulating layer 160, the present disclosure is not limited thereto. In some other embodiments, the width of the fourth wiring pattern 195 in the horizontal direction DR1 may decrease toward the third interlayer insulating layer 160.

The fourth wiring pattern 195 may include a second barrier layer and a second wiring layer. The second barrier layer of the fourth wiring pattern 195 may form a lower surface of the fourth wiring pattern 195. The second barrier layer of the fourth wiring pattern 195 may be in contact with the upper surface of the third interlayer insulating layer 160. For example, the second barrier layer of the fourth wiring pattern 195 may be conformally formed on the upper surface of the third interlayer insulating layer 160. However, the present disclosure is not limited thereto.

In example embodiments, materials formed of the first barrier layer and the first wiring layer of the fourth wiring pattern 195 may be the same as the materials formed of the second barrier layer 191 and the second wiring layer 192 of the third wiring pattern 190 as described above.

The fourth interlayer insulating layer 180 may be disposed on the third interlayer insulating layer 160. The fourth interlayer insulating layer 180 may surround each of the side wall of the third wiring pattern 190 and the side wall of the fourth wiring pattern 195. For example, the fourth interlayer insulating layer 180 may surround both side walls of the third wiring pattern 190 and both side walls of the fourth wiring pattern 195.

An upper surface of the fourth interlayer insulating layer 180 may be formed on the same plane as each of an upper surface of the third wiring pattern 190 and an upper surface of the fourth wiring pattern 195. The fourth interlayer insulating layer 180 may include, for example, at least one of silicon oxide, silicon nitride, silicon oxynitride and a low dielectric constant material.

In the semiconductor device according to some embodiments of the present disclosure, since the first wiring pattern 130 is formed on the contact plug 120 in which a part of the upper part is etched to ensure an isolation margin between the first wiring pattern 130 and the second wiring pattern 135 adjacent to the first wiring pattern 130, the reliability of the semiconductor device can be improved.

Hereinafter, a semiconductor device according to some other embodiments of the present disclosure will be described referring to FIG. 3. Differences from the semiconductor device shown in FIGS. 1 and 2 will be mainly described for the purpose of convenience in explanation.

Figure 3:
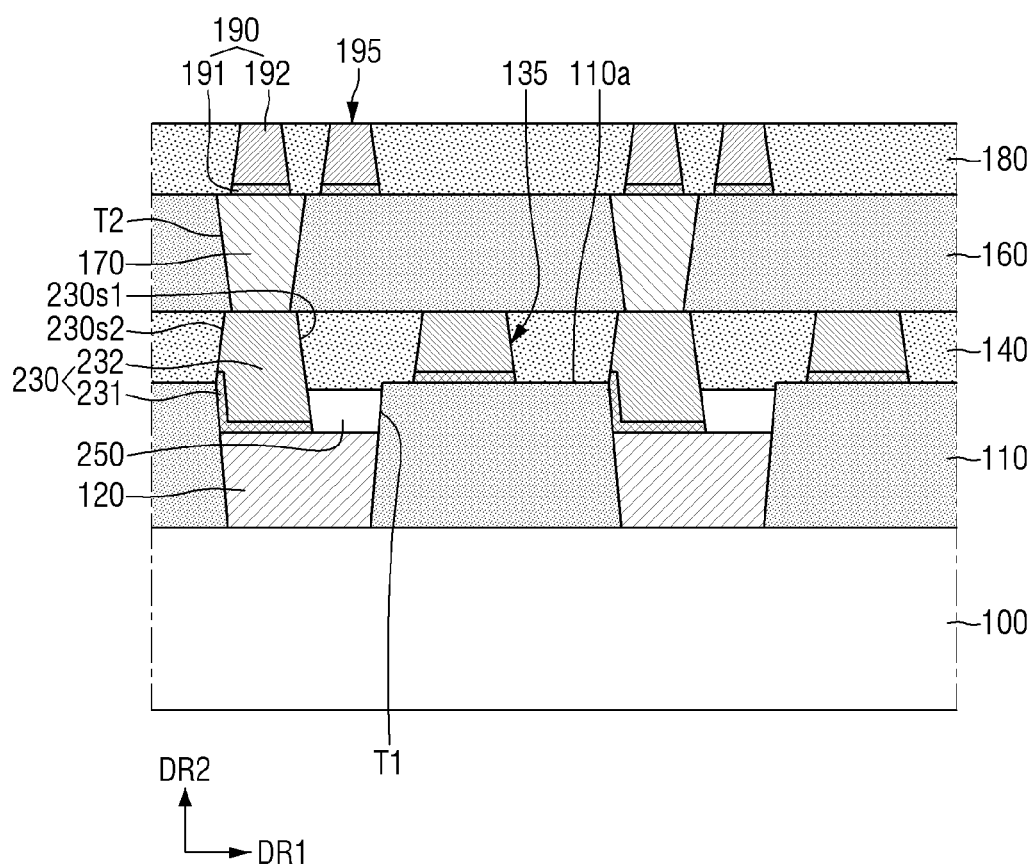
FIG. 3 is a diagram for explaining a semiconductor device according to some other embodiments of the present disclosure.

FIG. 3 is a diagram for explaining a semiconductor device according to some other embodiments of the present disclosure.

Referring to FIG. 3, in the semiconductor device according to some other embodiments of the present disclosure, an air gap 250 may be formed on only one side wall of a first wiring pattern 230. Specifically, the air gap 250 may be formed on a first side wall 230s1 of the first wiring pattern 230. A second side wall 230s2 of the first wiring pattern 230 opposite to the first side wall 230s1 of the first wiring pattern 230 may be in contact with the first interlayer insulating layer 110.

Although FIG. 3 shows that the second interlayer insulating layer 140 is not disposed between the second side wall 230s2 of the first wiring pattern 230 and the first interlayer insulating layer 110, the present disclosure is not limited thereto. In some other embodiments, the second interlayer insulating layer 140 may also be disposed in a partial space between the second side wall 230s2 of the first wiring pattern 230 and the first interlayer insulating layer 110.

The first wiring pattern 230 may include a first barrier layer 231 and a first wiring layer 232. The first barrier layer 231 may form a side wall of the first wiring pattern 230 being in contact with the first interlayer insulating layer 110, and the lower surface of the first wiring pattern 230 being in contact with the contact plug 120. The first barrier layer 231 may be in contact with the upper surface 120a of the contact plug 120 and the first interlayer insulating layer 110. The first wiring layer 232 may be disposed on the first barrier layer 231.

Hereinafter, a semiconductor device according to some other embodiments of the present disclosure will be described referring to FIGS. 4 and 5. Differences from the semiconductor devices shown in FIGS. 1 and 2 will be mainly described for the purpose of convenience in explanation.

Figure 4:
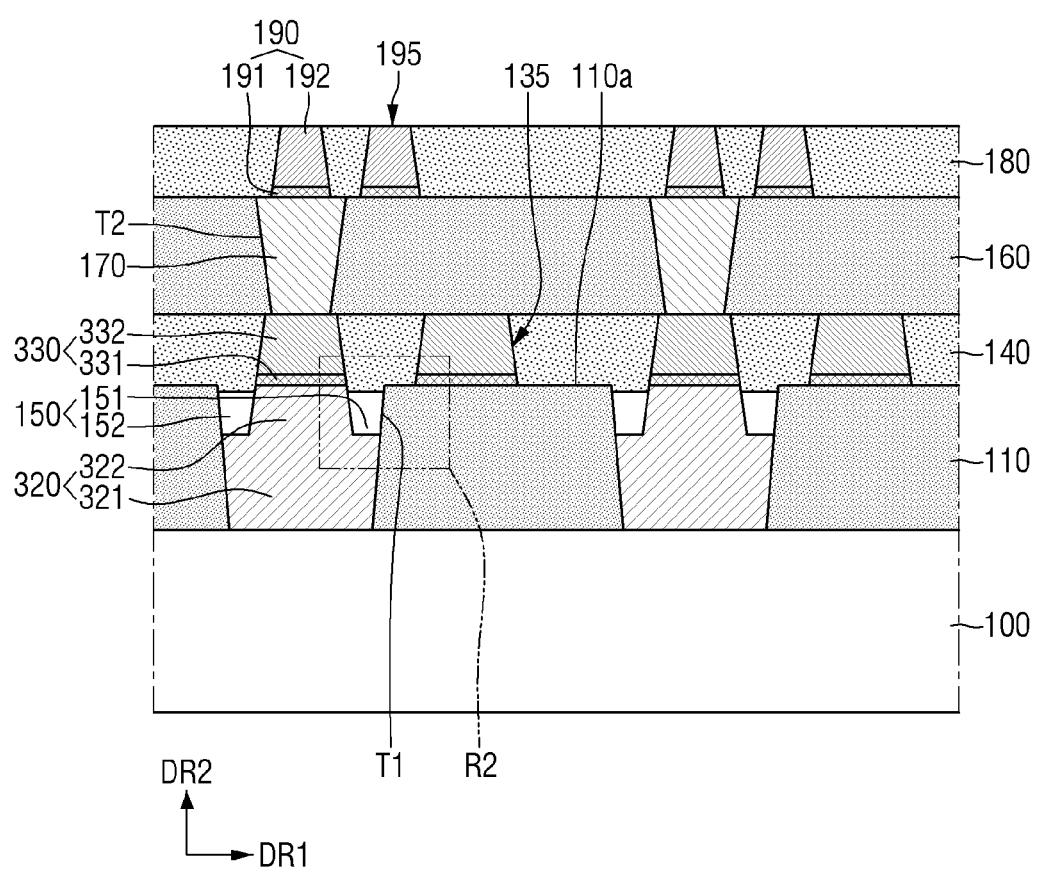
FIG. 4 is a diagram for explaining a semiconductor device according to some other embodiments of the present disclosure.

FIG. 4 is a diagram for explaining a semiconductor device according to some other embodiments of the present disclosure. FIG. 5 is an enlarged view of a region R2 of FIG. 4.

Figure 5:
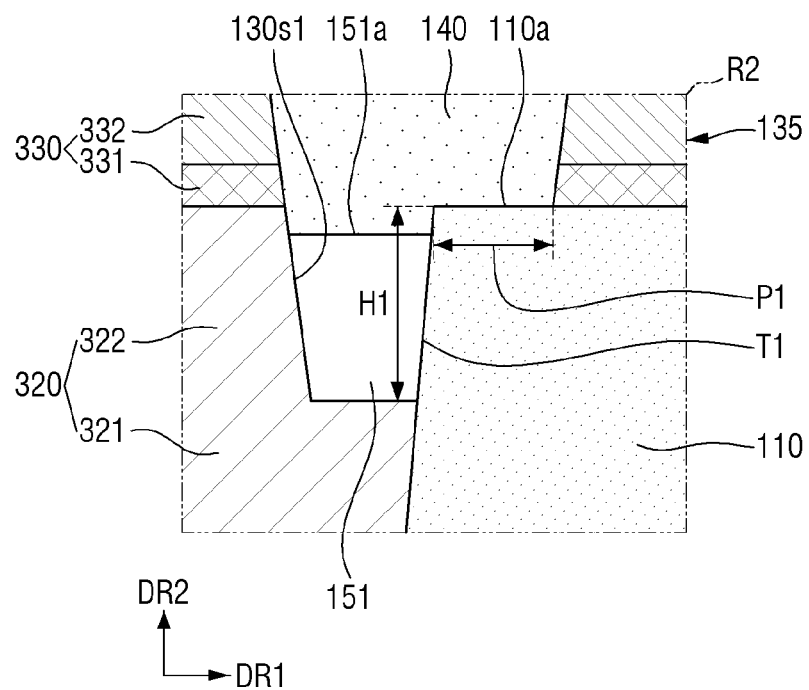
FIG. 5 is an enlarged view of a region R2 of FIG. 4.

Referring to FIGS. 4 and 5, in the semiconductor device according to some other embodiments of the present disclosure, a contact plug 320 may include a first portion 321, and a second portion 322 that protrudes from the first portion 321 in the vertical direction. Each of the first portion 321 of the contact plug 320 and the second portion 322 of the contact plug 320 may be disposed inside the first trench T1.

Side walls of the first portion 321 of the contact plug 320 may be in contact with the first interlayer insulating layer 110. The side walls of the second portion 322 of the contact plug 320 may be spaced apart from the first interlayer insulating layer 110.

The air gap 150 may be formed on both side walls of the second portion 322 of the contact plug 320, between an upper surface of the first portion 321 of the contact plug 320 and the second interlayer insulating layer 140. For example, the air gap 150 may be formed between each of side walls of the second portion 322 of the contact plug 320 and the first interlayer insulating layer 110. The air gap 150 may include a first air gap 151 and a second air gap 152. The first air gap 151 may be spaced apart from the second air gap 152 in the horizontal direction DR1.

The first air gap 151 may be an empty space which is surrounded by the upper surface of the first portion 321 of the contact plug 320, the first interlayer insulating layer 110, a first side wall of the second portion 322 of the contact plug 320, and the second interlayer insulating layer 140. Further, the second air gap 152 may be an empty space which is surrounded by the upper surface of the first portion 321 of the contact plug 320, the first interlayer insulating layer 110, a second side wall of the second portion 322 of the contact plug 320, and the second interlayer insulating layer 140. Here, the second side wall of the second portion 322 of the contact plug 320 means a side wall that is opposite to the first side wall of the second portion 322 of the contact plug 320.

An upper surface 151a of the air gap 150 may be formed to be lower than the upper surface 110a of the first interlayer insulating layer 110. Also, the upper surface 151a of the air gap 150 may be formed to be lower than an upper surface of the second portion 322 of the contact plug 320. A part of the side wall of the second portion 322 of the contact plug 320 may be in contact with the second interlayer insulating layer 140. However, the present disclosure is not limited thereto.

A first wiring pattern 330 may be disposed on the upper surface of the second portion 322 of the contact plug 320. An inclined profile of a side wall of the first wiring pattern 330 may be formed continuously with an inclined profile of the side wall of the second portion 322 of the contact plug 320. A lower surface of the first wiring pattern 330 may be formed on the same plane as the lower surface of the second wiring pattern 135.

The first wiring pattern 330 may include a first barrier layer 331 and a first wiring layer 332. The first barrier layer 331 may form the lower surface of the first wiring pattern 330. The first barrier layer 331 may be in contact with the upper surface of the second portion 322 of the contact plug 320. For example, the first barrier layer 331 may be conformally formed on the upper surface of the second portion 322 of the contact plug 320. The first wiring layer 332 may be disposed on the first barrier layer 331.

For example, the second wiring pattern 135 may be spaced apart from the first trench T1 in the horizontal direction DR1 by the first pitch P1. A first height H1 in the vertical direction DR2 from the upper surface of the first portion 321 of the contact plug 320 to the upper surface 110a of the first interlayer insulating layer 110 may be greater than the first pitch P1 between the first trench T1 and the second wiring pattern 135 in the horizontal direction DR1.

Hereinafter, a semiconductor device according to some other embodiments of the present disclosure will be described referring to FIG. 6. Differences from the semiconductor devices shown in FIGS. 1 and 2 will be mainly described for the purpose of convenience in explanation.

Figure 6:
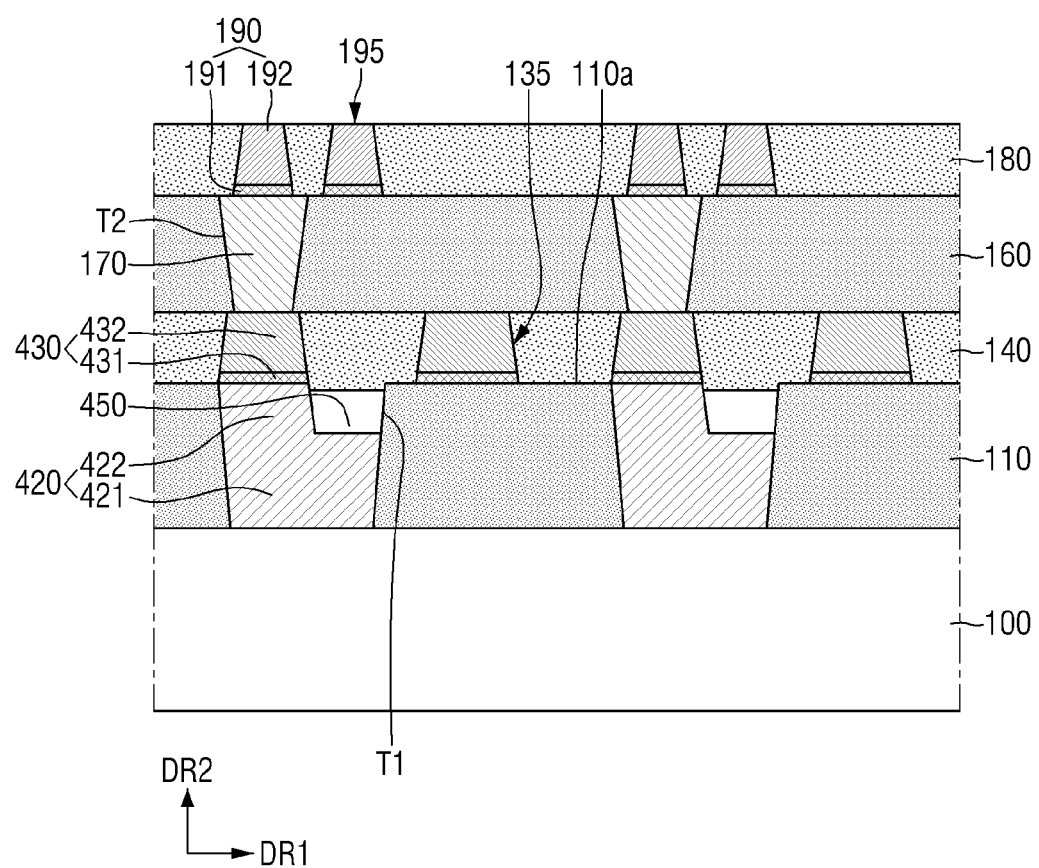
FIG. 6 is a diagram for explaining a semiconductor device according to some other embodiments of the present disclosure.

FIG. 6 is a diagram for explaining a semiconductor device according to some other embodiments of the present disclosure.

Referring to FIG. 6, in the semiconductor device according to some other embodiments of the present disclosure, a contact plug 420 may include a first portion 421, and a second portion 422 that protrudes from the first portion 421 in the vertical direction DR2. Each of the first portion 421 of the contact plug 420 and the second portion 422 of the contact plug 420 may be disposed inside the first trench T1.

An air gap 450 may be formed on only one side wall of the second portion 422 of the contact plug 420, between an upper surface of the first portion 421 of the contact plug 420 and the second interlayer insulating layer 140. The air gap 450 may be formed on a first side wall of the second portion 422 of the contact plug 420. The air gap 450 may be formed between the first side wall of the second portion 422 of the contact plug 420 and the first interlayer insulating layer 110. A second side wall of the second portion 422 of the contact plug 420 opposite to the first side wall of the second portion 422 of the contact plug 420 may be in contact with the first interlayer insulating layer 110.

The air gap 450 may be an empty space which is surrounded by the upper surface of the first portion 421 of the contact plug 420, the first interlayer insulating layer 110, the first side wall of the second portion 422 of the contact plug 420, and the second interlayer insulating layer 140.

Although FIG. 6 shows that the second interlayer insulating layer 140 is not disposed between a second side wall of a first wiring pattern 430 and the first interlayer insulating layer 110, the present disclosure is not limited thereto. In some other embodiments, the second interlayer insulating layer 140 may be disposed in a partial space between the second side wall of the first wiring pattern 430 and the first interlayer insulating layer 110.

An upper surface of the air gap 450 may be formed to be lower than the upper surface 110a of the first interlayer insulating layer 110. Also, the upper surface of the air gap 450 may be formed to be lower than an upper surface of the second portion 422 of the contact plug 420. A part of the first side wall of the second portion 422 of the contact plug 420 may be in contact with the second interlayer insulating layer 140. However, the present disclosure is not limited thereto.

The first wiring pattern 430 may be disposed on the upper surface of the second portion 422 of the contact plug 420. An inclined profile of a first side wall of the first wiring pattern 430 may be formed continuously with an inclined profile of the first side wall of the second portion 422 of the contact plug 420. A lower surface of the first wiring pattern 430 may be formed on the same plane as the lower surface of the second wiring pattern 135.

The first wiring pattern 430 may include a first barrier layer 431 and a first wiring layer 432. The first barrier layer 431 may form the lower surface of the first wiring pattern 430. The first barrier layer 431 may be in contact with the upper surface of the second portion 422 of the contact plug 420. For example, the first barrier layer 431 may be conformally formed on the upper surface of the second portion 422 of the contact plug 420. The first wiring layer 432 may be disposed on the first barrier layer 431.

Hereinafter, a semiconductor device according to some other embodiments of the present disclosure will be described referring to FIGS. 7 and 8. Differences from the semiconductor devices shown in FIGS. 1 and 2 will be mainly described for the purpose of convenience in explanation.

Figure 7:
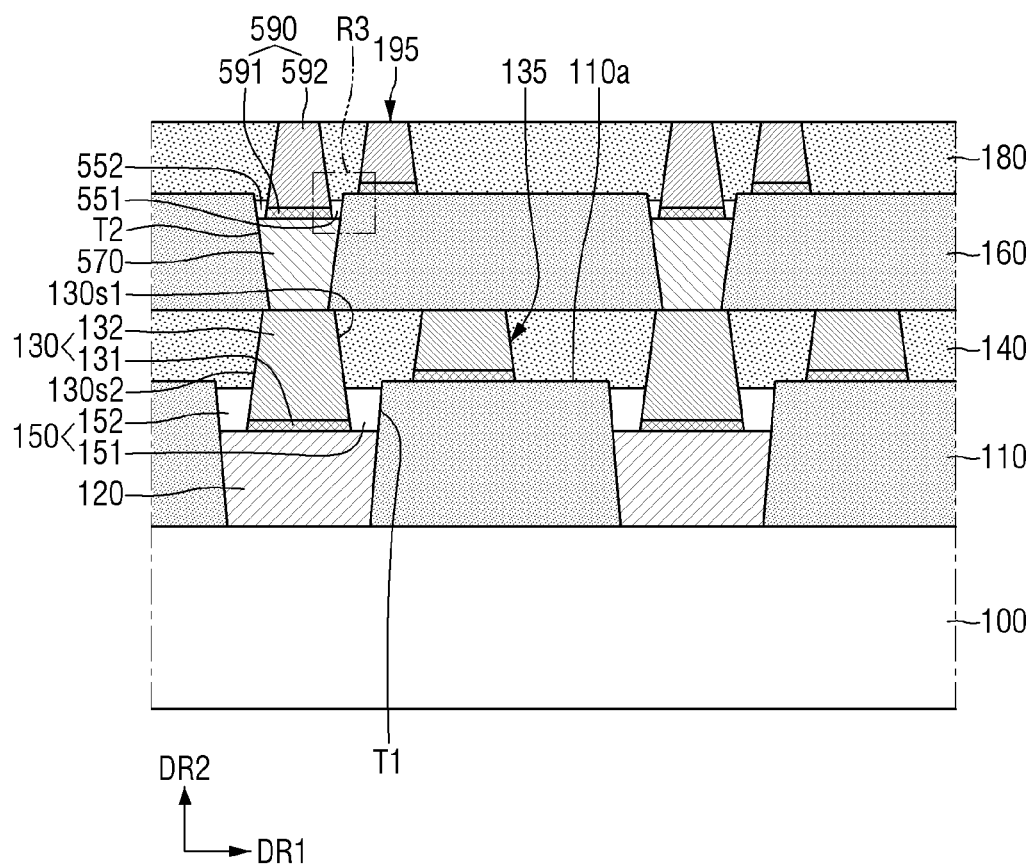
FIG. 7 is a diagram for explaining a semiconductor device according to some other embodiments of the present disclosure.

FIG. 7 is a diagram for explaining a semiconductor device according to some other embodiments of the present disclosure. FIG. 8 is an enlarged view of a region R3 of FIG. 7.

Figure 8:
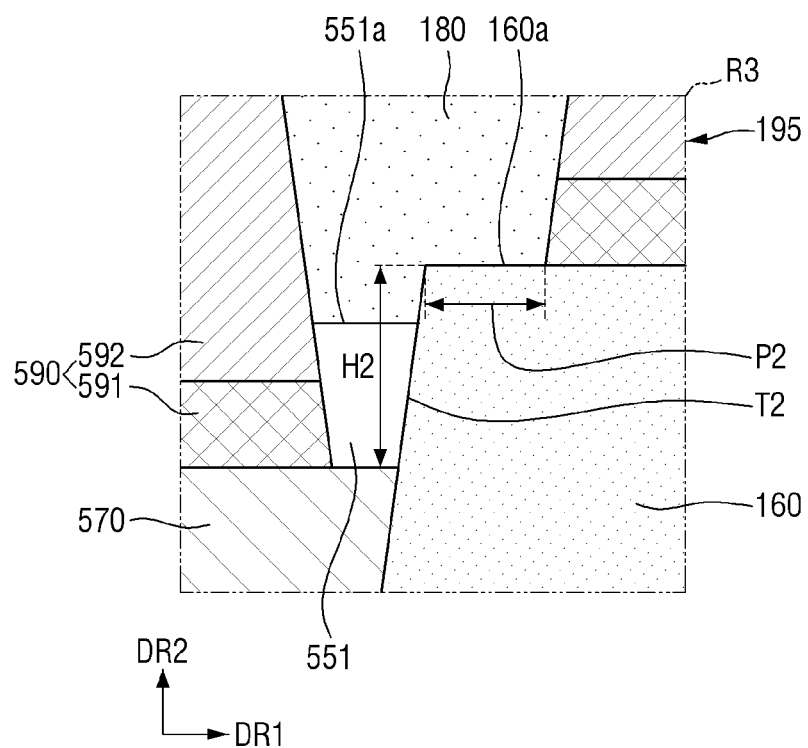
FIG. 8 is an enlarged view of a region R3 of FIG. 7.

Referring to FIGS. 7 and 8, in the semiconductor device according to some other embodiments of the present disclosure, a third air gap 551 and a fourth air gap 552 may be formed on an upper surface of a via 570.

The via 570 may be disposed inside the second trench T2. The upper surface of the via 570 may be formed to be lower than the upper surface of the third interlayer insulating layer 160. For example, at least a part of the third interlayer insulating layer 160 may be exposed to the second trench T2 on an upper surface of the via 570.

A side wall of a third wiring pattern 590 may have an inclined profile. For example, a width of the third wiring pattern 590 in the horizontal direction DR1 may increase toward the via 570. After the third wiring pattern 590 is formed through the patterning process, the fourth interlayer insulating layer 180 may be formed. Accordingly, the inclined profile of the side wall of the third wiring pattern 590 may be formed as described above.

The third wiring pattern 590 may include a second barrier layer 591 and a second wiring layer 592. The second barrier layer 591 may form a lower surface of the third wiring pattern 590. The second barrier layer 591 may be in contact with the upper surface of the via 570. For example, the second barrier layer 591 may be conformally formed on the upper surface of the via 570.

In example embodiments, materials formed of the second barrier layer 591 and the second wiring layer 592 of the wiring pattern 590 may be the same as the materials formed of the second barrier layer 191 and the second wiring layer 192 of the third wiring pattern 190 as described above.

The fourth wiring pattern 195 may be disposed on an upper surface 160a of the third interlayer insulating layer 160. The fourth wiring pattern 195 may be spaced apart from the third wiring pattern 590 in the horizontal direction DR1.

For example, the fourth wiring pattern 195 may be spaced apart from the second trench T2 in the horizontal direction DR1 by a second pitch P2. A second height H2 in the vertical direction DR2 from the upper surface of the via 570 to the upper surface 160a of the third interlayer insulating layer 160 may be greater than the second pitch P2 between the second trench T2 and the fourth wiring pattern 195 in the horizontal direction DR1.

Each of the third air gap 551 and the fourth air gap 552 may be formed on the upper surface of the via 570 inside the second trench T2. The third air gap 551 may be spaced apart from the fourth air gap 552 in the horizontal direction DR1. The third air gap 551 and the fourth air gap 552 may be formed on both side walls of the third wiring pattern 590, between the upper surface of the via 570 and the fourth interlayer insulating layer 180.

For example, the third air gap 551 may be formed on a first side wall of the third wiring pattern 590. The fourth air gap 552 may be formed on a second side wall of the third wiring pattern 590 that is opposite to the first side wall of the third wiring pattern 590. For example, at least a part of the third wiring pattern 590 may be disposed between the third air gap 551 and the fourth air gap 552.

The third air gap 551 may be an empty space which is surrounded by the upper surface of the via 570, the third interlayer insulating layer 160, the first side wall of the third wiring pattern 590, and the fourth interlayer insulating layer 180. Further, the fourth air gap 552 may be an empty space which is surrounded by the upper surface of the via 570, the third interlayer insulating layer 160, the second side wall of the third wiring pattern 590, and the fourth interlayer insulating layer 180. Each of an upper surface 551a of the third air gap 551 and an upper surface of the fourth air gap 552 may be formed to be lower than the upper surface 160a of the third interlayer insulating layer 160.

Hereinafter, a semiconductor device according to some other embodiments of the present disclosure will be described referring to FIG. 9. Differences from the semiconductor device shown in FIGS. 7 and 8 will be mainly described for the purpose of convenience in explanation.

Figure 9:
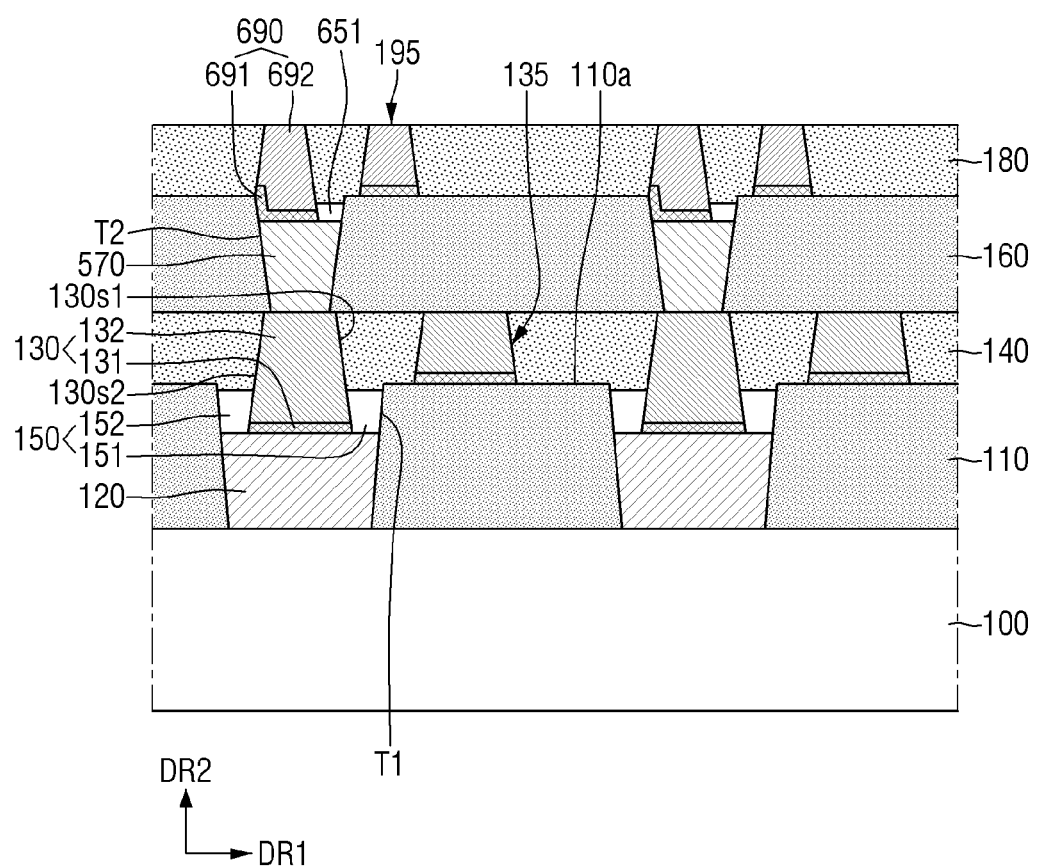
FIG. 9 is a diagram for explaining a semiconductor device according to some other embodiments of the present disclosure.

FIG. 9 is a diagram for explaining a semiconductor device according to some other embodiments of the present disclosure.

Referring to FIG. 9, in the semiconductor device according to some other embodiments of the present disclosure, a third air gap 651 may be formed on only one side wall of a third wiring pattern 690. Specifically, the third air gap 651 may be formed on a first side wall of the third wiring pattern 690. A second side wall of the third wiring pattern 690 that is opposite to the first side wall of the third wiring pattern 690 may be in contact with the third interlayer insulating layer 160.

Although FIG. 9 shows that the fourth interlayer insulating layer 180 is not disposed between the second side wall of the third wiring pattern 690 and the third interlayer insulating layer 160, the present disclosure is not limited thereto. In some other embodiments, the fourth interlayer insulating layer 180 may be disposed in a partial space between the second side wall of the third wiring pattern 690 and the third interlayer insulating layer 160.

The third wiring pattern 690 may include a second barrier layer 691 and a second wiring layer 692. The second barrier layer 691 may form a side wall of the third wiring pattern 690 being in contact with the third interlayer insulating layer 160, and a lower surface of the third wiring pattern 690 being in contact with the via 570. The second barrier layer 691 may be in contact with the upper surface of the via 570 and the third interlayer insulating layer 160. The second wiring layer 692 may be disposed on the second barrier layer 691.

Hereinafter, a semiconductor device according to some other embodiments of the present disclosure will be described referring to FIGS. 10 and 11. Differences from the semiconductor device shown in FIGS. 7 and 8 will be mainly described for the purpose of convenience in explanation.

Figure 10:
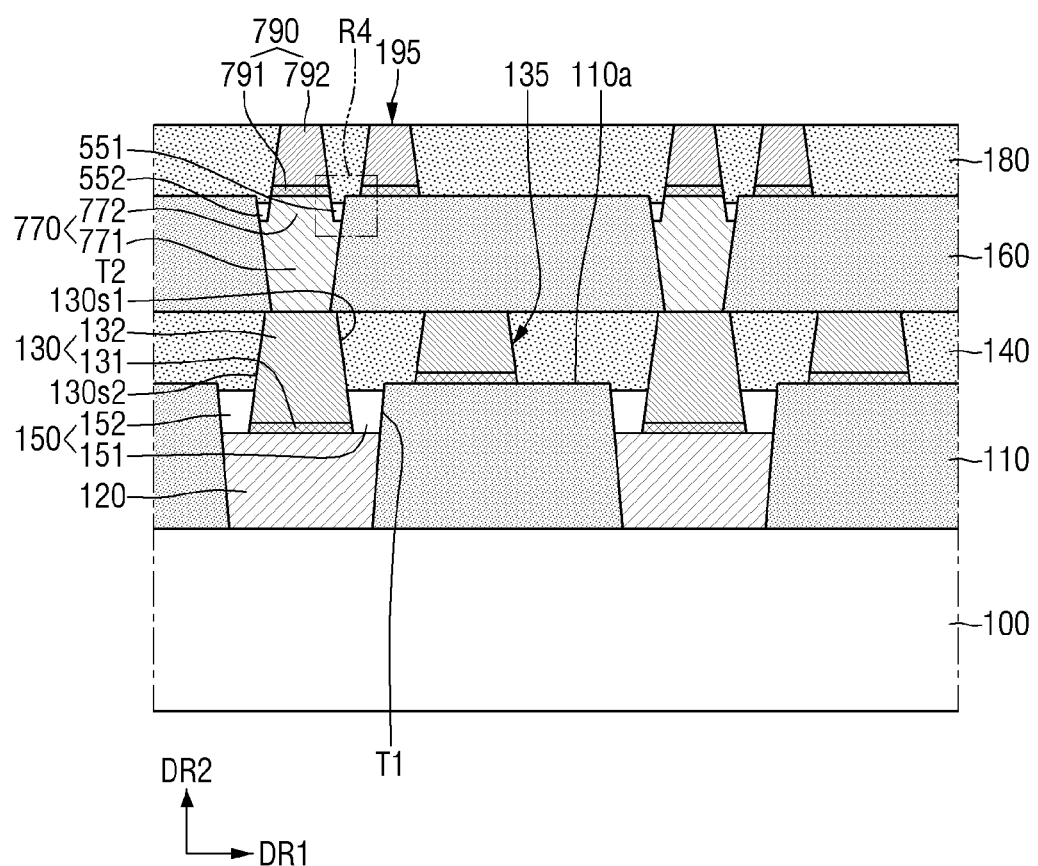
FIG. 10 is a diagram for explaining a semiconductor device according to some other embodiments of the present disclosure.

FIG. 10 is a diagram for explaining a semiconductor device according to some other embodiments of the present disclosure. FIG. 11 is an enlarged view of a region R4 of FIG. 10.

Figure 11:
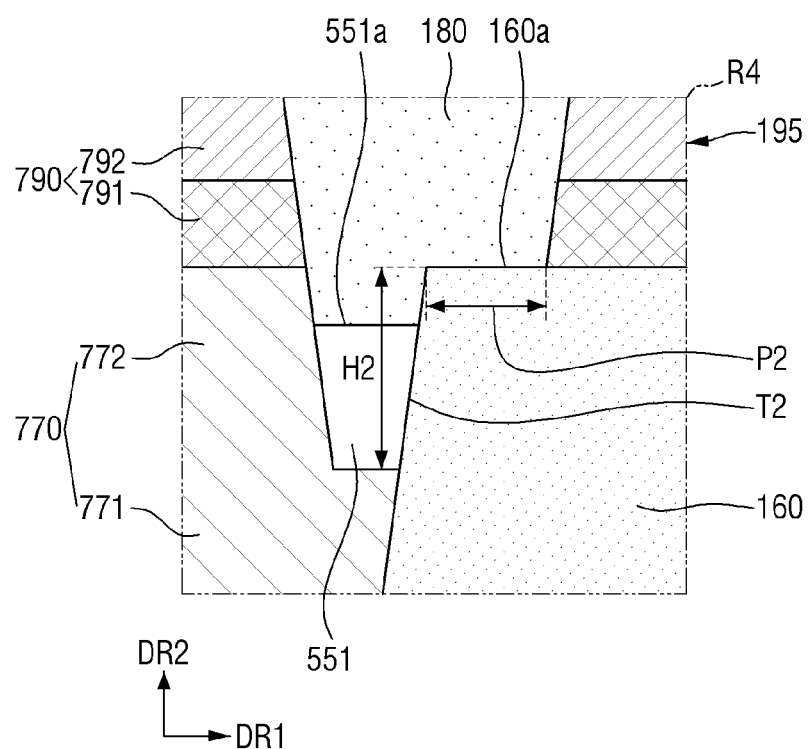
FIG. 11 is an enlarged view of a region R4 of FIG. 10.

Referring to FIGS. 10 and 11, in the semiconductor device according to some other embodiments of the present disclosure, a via 770 may include a first portion 771, and a second portion 772 protruding from the first portion 771 in the vertical direction DR2. Each of the first portion 771 of the via 770 and the second portion 772 of the via 770 may be disposed inside the second trench T2.

Side walls of the first portion 771 of the via 770 may be in contact with the third interlayer insulating layer 160. Side walls of the second portion 772 of the via 770 may be spaced apart from the third interlayer insulating layer 160.

The third air gap 551 and the fourth air gap 552 may be formed on both side walls of the second portion 772 of the via 770, between an upper surface of the first portion 771 of the via 770 and the fourth interlayer insulating layer 180. For example, each of the third air gap 551 and the fourth air gap 552 may be formed between both side walls of the second portion 772 of the via 770 and the third interlayer insulating layer 160.

The third air gap 551 may be an empty space which is surrounded by the upper surface of the first portion 771 of the via 770, the third interlayer insulating layer 160, a first side wall of the second portion 772 of the via 770, and the fourth interlayer insulating layer 180. Further, the fourth air gap 552 may be an empty space which is surrounded by the upper surface of the first portion 771 of the via 770, the third interlayer insulating layer 160, a second side wall of the second portion 772 of the via 770, and the fourth interlayer insulating layer 180. Here, the second side wall of the second portion 772 of the via 770 means a side wall which is opposite to the first side wall of the second portion 772 of the via 770.

Each of the upper surface 551a of the third air gap 551 and the upper surface of the fourth air gap 552 may be formed to be lower than the upper surface 160a of the third interlayer insulating layer 160. Further, each of the upper surface 551a of the third air gap 551 and the upper surface of the fourth air gap 552 may be formed to be lower than an upper surface of the second portion 772 of the via 770. A part of the side wall of the second portion 772 of the via 770 may be in contact with the fourth interlayer insulating layer 180. However, the present disclosure is not limited thereto.

The third wiring pattern 790 may be disposed on the upper surface of the second portion 772 of the via 770. An inclined profile of side wall of the third wiring pattern 790 may be formed continuously with an inclined profile of side wall of the second portion 772 of the via 770. A lower surface of the third wiring pattern 790 may be formed on the same plane as the lower surface of the fourth wiring pattern 195.

The third wiring pattern 790 may include a second barrier layer 791 and a second wiring layer 792. The second barrier layer 791 may form the lower surface of the third wiring pattern 790. The second barrier layer 791 may be in contact with the upper surface of the second portion 772 of the via 770. For example, the second barrier layer 791 may be conformally formed on the upper surface of the second portion 772 of the via 770. The second wiring layer 792 may be disposed on the second barrier layer 791.

Hereinafter, a semiconductor device according to some other embodiments of the present disclosure will be described referring to FIG. 12. Differences from the semiconductor device shown in FIGS. 7 and 8 will be mainly described for the purpose of convenience in explanation.

Figure 12:
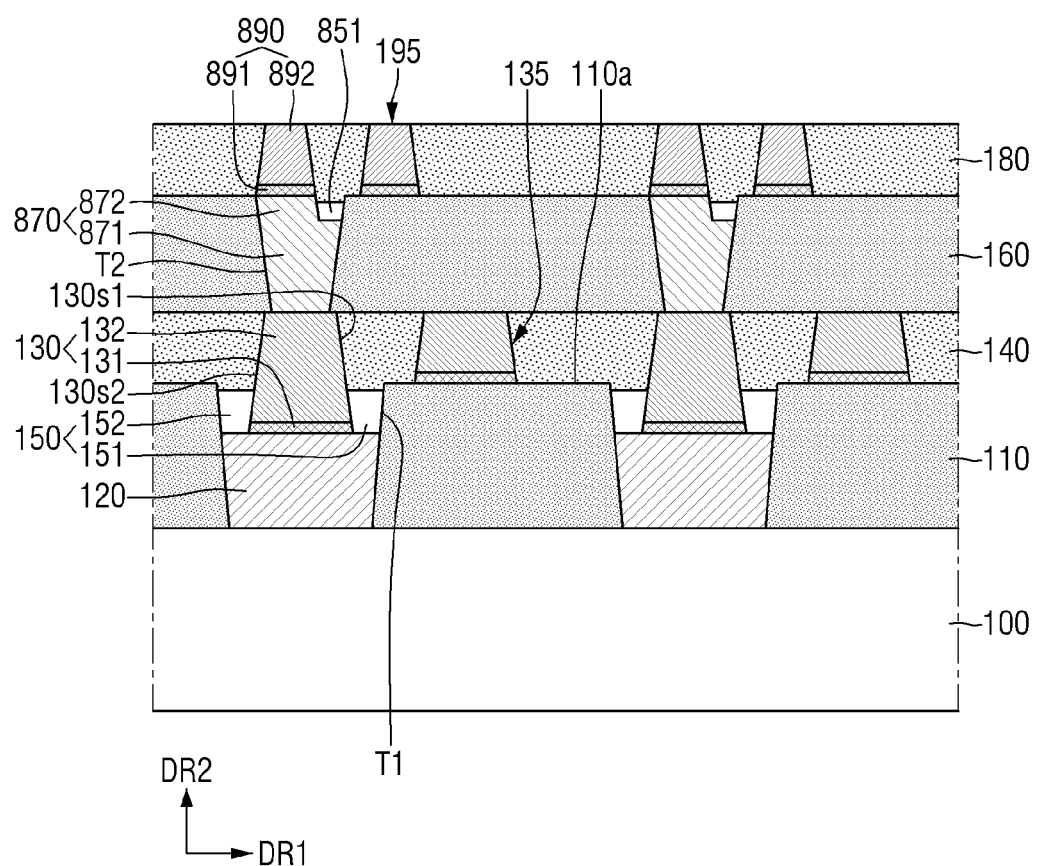
FIG. 12 is a diagram for explaining a semiconductor device according to some other embodiments of the present disclosure.

FIG. 12 is a diagram for explaining a semiconductor device according to some other embodiments of the present disclosure.

Referring to FIG. 12, in the semiconductor device according to some other embodiments of the present disclosure, a via 870 may include a first portion 871, and a second portion 872 that protrudes from the first portion 871 in the vertical direction DR2. Each of the first portion 871 of the via 870 and the second portion 872 of the via 870 may be disposed inside the second trench T2.

A third air gap 851 may be formed on only one side wall of the second portion 872 of the via 870, between an upper surface of the first portion 871 of the via 870 and the fourth interlayer insulating layer 180. The third air gap 851 may be formed on a first side wall of the second portion 872 of the via 870. The third air gap 851 may be formed between the first side wall of the second portion 872 of the via 870 and the third interlayer insulating layer 160. A second side wall of the second portion 872 of the via 870 that is opposite to the first side wall of the second portion 872 of the via 870 may be in contact with the third interlayer insulating layer 160.

The third air gap 851 may be an empty space which is surrounded by the upper surface of the first portion 871 of the via 870, the third interlayer insulating layer 160, the first side wall of the second portion 872 of the via 870, and the fourth interlayer insulating layer 180.

Although FIG. 12 shows that the fourth interlayer insulating layer 180 is not disposed between a second side wall of the third wiring pattern 890 and the third interlayer insulating layer 160, the present disclosure is not limited thereto. In some other embodiments, the fourth interlayer insulating layer 180 may be disposed in a partial space between the second side wall of the third wiring pattern 890 and the third interlayer insulating layer 160.

An upper surface of the third air gap 851 may be formed to be lower than the upper surface of the third interlayer insulating layer 160. Also, the upper surface of the third air gap 851 may be formed to be lower than an upper surface of the second portion 872 of the via 870. A part of the first side wall of the second portion 872 of the via 870 may be in contact with the fourth interlayer insulating layer 180. However, the present disclosure is not limited thereto.

The third wiring pattern 890 may be disposed on the upper surface of the second portion 872 of the via 870. An inclined profile of a first side wall of the third wiring pattern 890 may be formed continuously with an inclined profile of the first side wall of the second portion 872 of the via 870. A lower surface of the third wiring pattern 890 may be formed on the same plane as the lower surface of the fourth wiring pattern 195.

The third wiring pattern 890 may include a second barrier layer 891 and a second wiring layer 892. The second barrier layer 891 may form the lower surface of the third wiring pattern 890. The second barrier layer 891 may be in contact with the upper surface of the second portion 872 of the via 870. For example, the second barrier layer 891 may be conformally formed on the upper surface of the second portion 872 of the via 870. The second wiring layer 892 may be disposed on the second barrier layer 891.

In example embodiments, materials formed of the second barrier layer 891 and the second wiring layer 892 of the wiring pattern 890 may be the same as the materials formed of the second barrier layer 591 and the second wiring layer 592 of the third wiring pattern 590 as described above.

Hereinafter, a method for fabricating a semiconductor device according to some embodiments of the present disclosure will be described referring to FIGS. 1, 13 to 18.

FIGS. 13 to 18 are intermediate stage diagrams for explaining a method for fabricating a semiconductor device according to some embodiments of the present disclosure.

Figure 13:
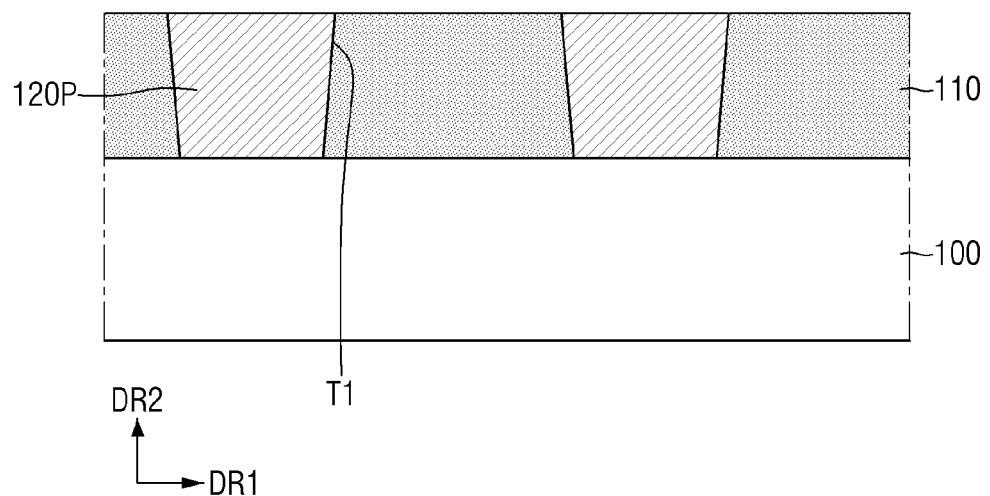
FIGS. 13 to 18 are intermediate stage diagrams for explaining a method for fabricating a semiconductor device according to some embodiments of the present disclosure.

Referring to FIG. 13, the first interlayer insulating layer 110 may be formed on the substrate 100. Subsequently, the first trench T1 extending in the vertical direction DR2 may be formed inside the first interlayer insulating layer 110. A part of the substrate 100 may be exposed by the first trench T1.

Subsequently, a pre contact plug 120p may be formed inside the first trench T1. For example, the pre contact plug 120p may completely fill the first trench T1.

Figure 14:
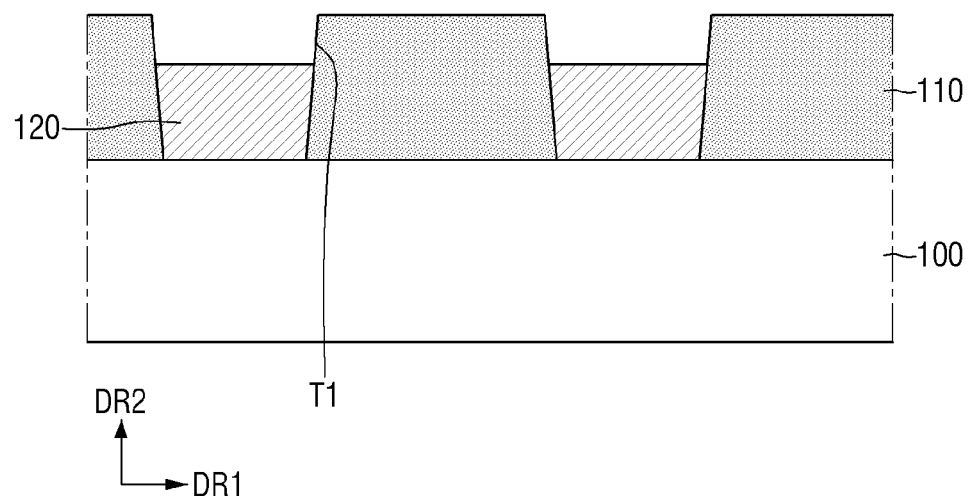

Referring to FIG. 14, the upper part of the pre contact plug 120p may be etched entirely. A part of the pre contact plug 120p that remains inside the first trench T1 may form the contact plug 120. An upper surface of the contact plug 120 may be formed to be lower than an upper surface of the first interlayer insulating layer 110.

Figure 15:
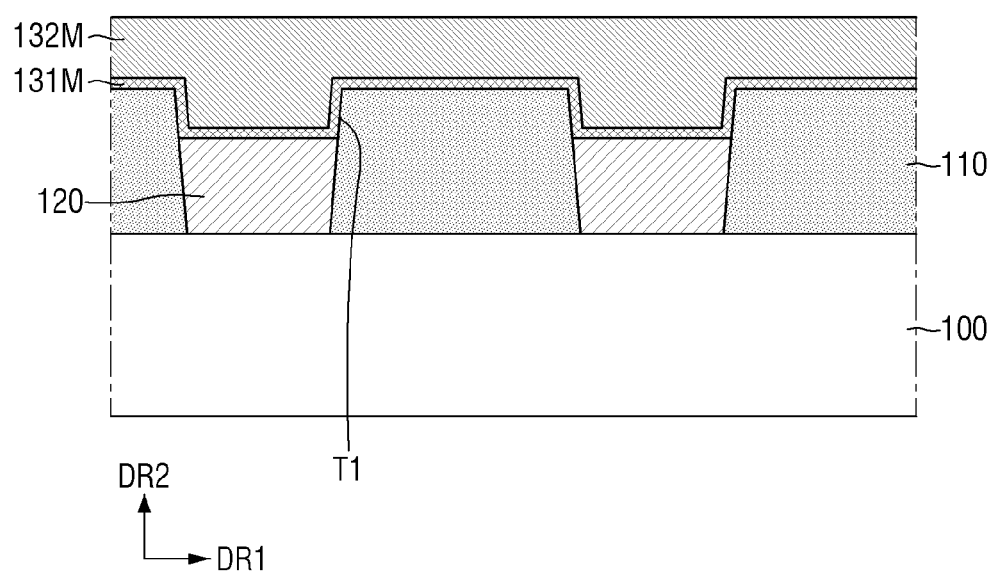

Referring to FIG. 15, a first barrier material layer 131M may be formed on upper surfaces of the first interlayer insulating layer 110 and the contact plug 120. For example, the first barrier material layer 131M may be conformally formed. However, the present disclosure is not limited thereto.

Subsequently, a first wiring material layer 132M may be formed on the first barrier material layer 131M. The first trench T1 may be completely filled by the contact plug 120, the first barrier material layer 131M and the first wiring material layer 132M.

Figure 16:
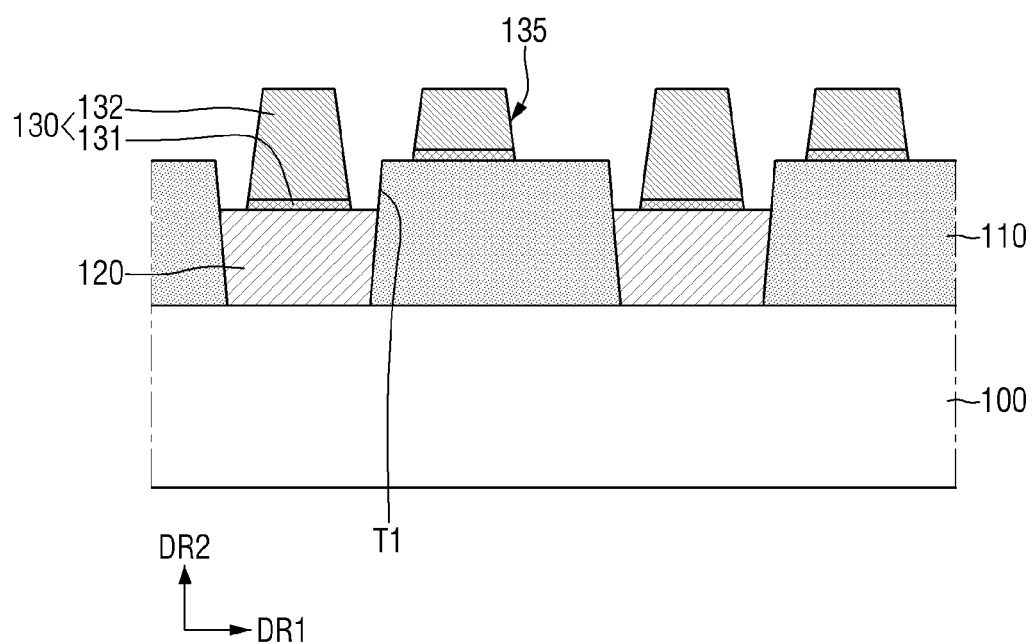

Referring to FIG. 16, a patterning process may be performed on the first barrier material layer 131M and the first wiring material layer 132M. Through the patterning process, the first wiring pattern 130 may be formed on the contact plug 120, and the second wiring pattern 135 may be formed on the first interlayer insulating layer 110.

A part of the first wiring pattern 130 may be formed inside the first trench T1. The second wiring pattern 135 may be spaced apart from the first wiring pattern 130 in the horizontal direction DR1. Each of the first wiring pattern 130 and the second wiring pattern 135 may include the first barrier layer 131 and the first wiring layer 132.

The second wiring pattern 135 may be spaced apart from the first trench T1 in the horizontal direction DR1 by the first pitch (P1 of FIG. 2). The first height (H1 of FIG. 2) in the vertical direction DR2 from the upper surface (120a of FIG. 2) of the contact plug 120 to the upper surface (110a of FIG. 2) of the first interlayer insulating layer 110 may be greater than the first pitch (P1 of FIG. 2) between the first trench T1 and the second wiring pattern 135 in the horizontal direction DR1.

Figure 17:
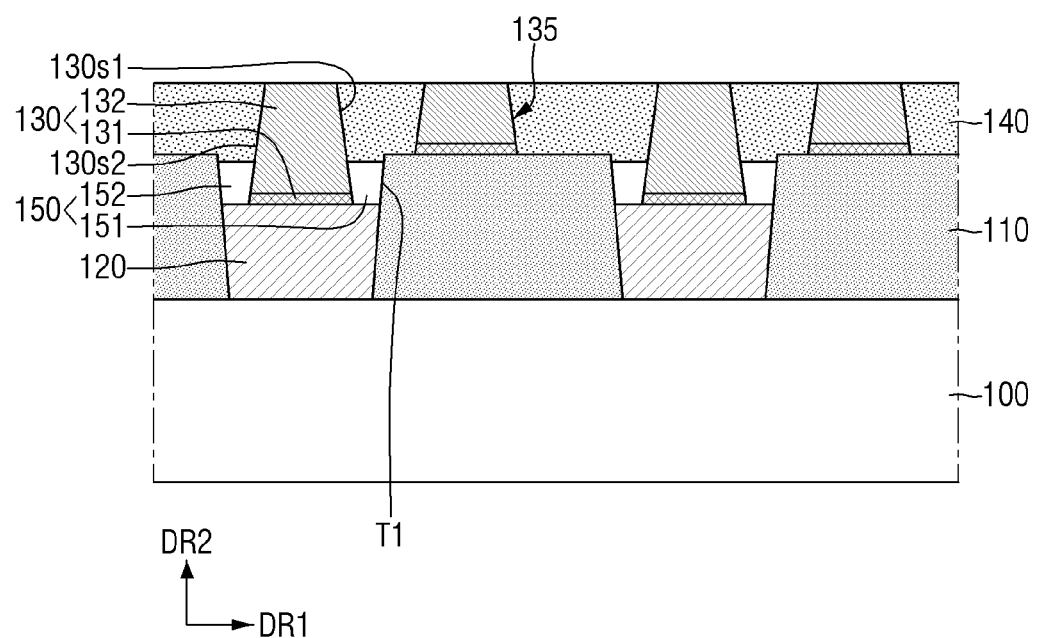

Referring to FIG. 17, the second interlayer insulating layer 140 may be formed on the first interlayer insulating layer 110. The second interlayer insulating layer 140 may surround a part of the side wall of the first wiring pattern 130 and the side wall of the second wiring pattern 135. For example, the second interlayer insulating layer 140 may surround a part of both side walls of the first wiring pattern 130 and both side walls of the second wiring pattern 135.

In this case, the air gap 150 may be formed on both side walls of the first wiring pattern 130 inside the first trench T1. Specifically, the first air gap 151 may be formed inside the first trench T1, between the first side wall 130s1 of the first wiring pattern 130 and the first interlayer insulating layer 110. The second air gap 152 may be formed inside the first trench T1, between the second side wall 130s2 of the first wiring pattern 130 and the first interlayer insulating layer 110.

A part of the second interlayer insulating layer 140 may be formed inside the first trench T1. For example, the upper surface of the air gap 150 may be formed to be lower than the upper surface of the first interlayer insulating layer 110. However, the present disclosure is not limited thereto.

Figure 18:
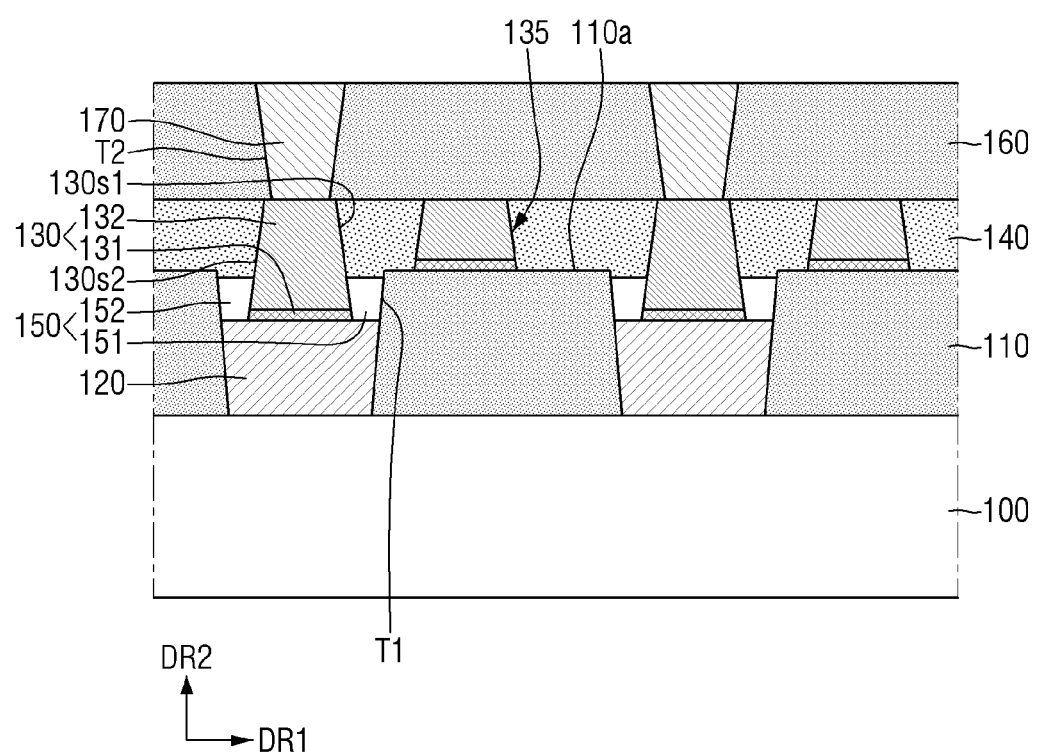

Referring to FIG. 18, the third interlayer insulating layer 160 may be formed on the second interlayer insulating layer 140. Subsequently, a second trench T2 extending in the vertical direction DR2 may be formed inside the third interlayer insulating layer 160. For example, the second trench T2 may expose a part of the upper surface of the first wiring pattern 130.

Subsequently, the via 170 may be formed inside the second trench T2. For example, the via 170 may completely fill the second trench T2.

Referring again to FIG. 1, the third wiring pattern 190 and the fourth wiring pattern 195 may be formed on the third interlayer insulating layer 160. For example, the third wiring pattern 190 and the fourth wiring pattern 195 may be formed through a patterning process. A width of each of the third wiring pattern 190 and the fourth wiring pattern 195 in the horizontal direction DR1 may increase toward the via 170 and the third interlayer insulating layer 160, respectively.

Subsequently, the fourth interlayer insulating layer 180 may be formed on the third interlayer insulating layer 160. The fourth interlayer insulating layer 180 may surround each of the side wall of the third wiring pattern 190 and the side wall of the fourth wiring pattern 195. For example, the fourth interlayer insulating layer 180 may surround both side walls of the third wiring pattern 190 and both side walls of the fourth wiring pattern 195.

In some other embodiments, the third wiring pattern 190 and the fourth wiring pattern 195 may also be formed by a damascene process. In this case, the width of each of the third wiring pattern 190 and the fourth wiring pattern 195 in the horizontal direction DR1 may decrease toward the via 170 and the third interlayer insulating layer 160, respectively.

Hereinafter, a method for fabricating a semiconductor device according to some other embodiments of the present disclosure will be described referring to FIGS. 4, 19 to 22.

FIGS. 19 to 22 are intermediate stage diagrams for explaining a method for fabricating a semiconductor device according to some other embodiments of the present disclosure.

Figure 19:
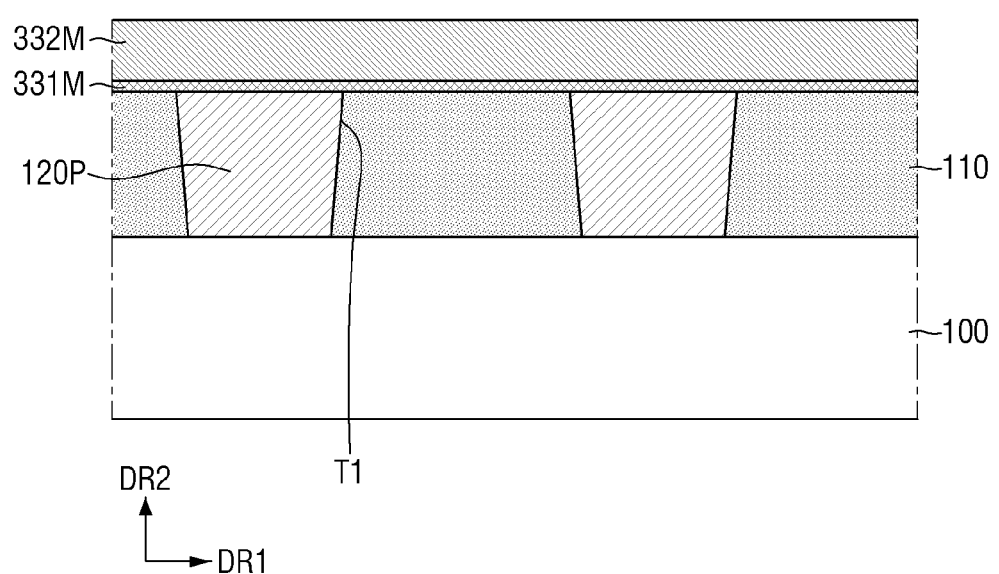
FIGS. 19 to 22 are intermediate stage diagrams for explaining a method for fabricating a semiconductor device according to some other embodiments of the present disclosure.

Referring to FIG. 19, the first interlayer insulating layer 110 may be formed on the substrate 100. Subsequently, the first trench T1 extending in the vertical direction DR2 may be formed inside the first interlayer insulating layer 110. A part of the substrate 100 may be exposed by the first trench T1.

Subsequently, the pre contact plug 120p may be formed inside the first trench T1. For example, the pre contact plug 120p may completely fill the first trench T1. Subsequently, a first barrier material layer 331M and a first wiring material layer 332M may be sequentially formed on the first interlayer insulating layer 110 and the pre contact plug 120p.

Figure 20:
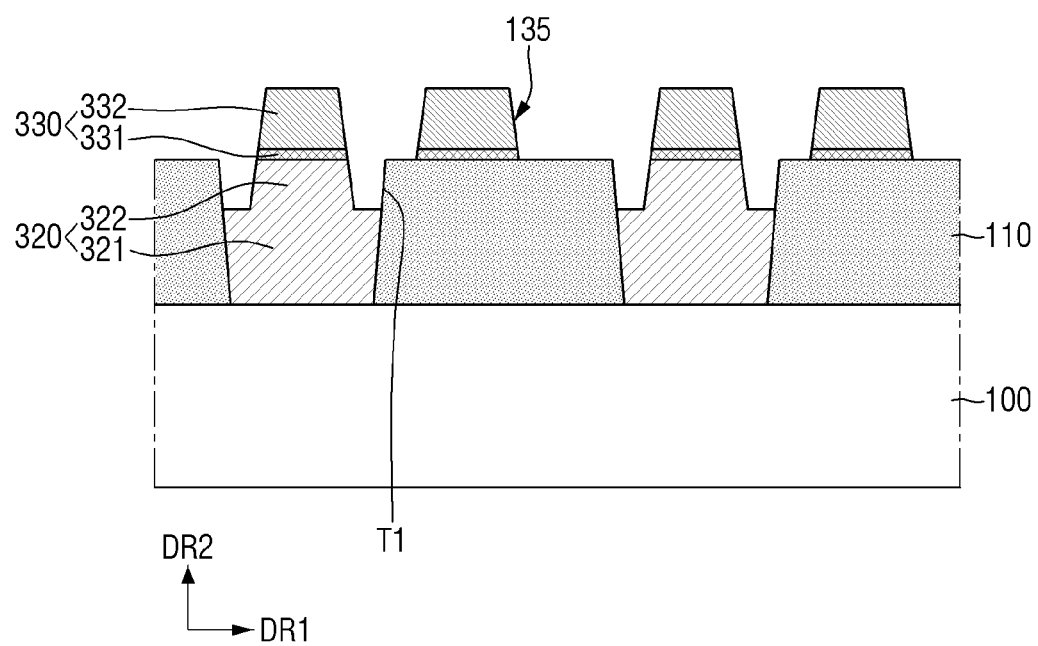

Referring to FIG. 20, a patterning process may be performed on the first barrier material layer 331M and the first wiring material layer 332M. Through the patterning process, the first wiring pattern 330 may be formed on the pre contact plug 120p, and the second wiring pattern 135 may be formed on the first interlayer insulating layer 110.

Further, a part of the upper part of the pre contact plug 120p may be etched to form the contact plug 320 through the patterning process.

The contact plug 320 may include the first portion 321, and the second portion 322 that protrudes from the first portion 321 in the vertical direction DR2. Through the patterning process, a part of the pre contact plug 120p which is in contact with the first interlayer insulating layer 110 may be etched to form the second portion 322 of the contact plug 320. The second portion 322 of the contact plug 320 may be spaced apart from the first interlayer insulating layer 110 in the horizontal direction DR1.

Figure 21:
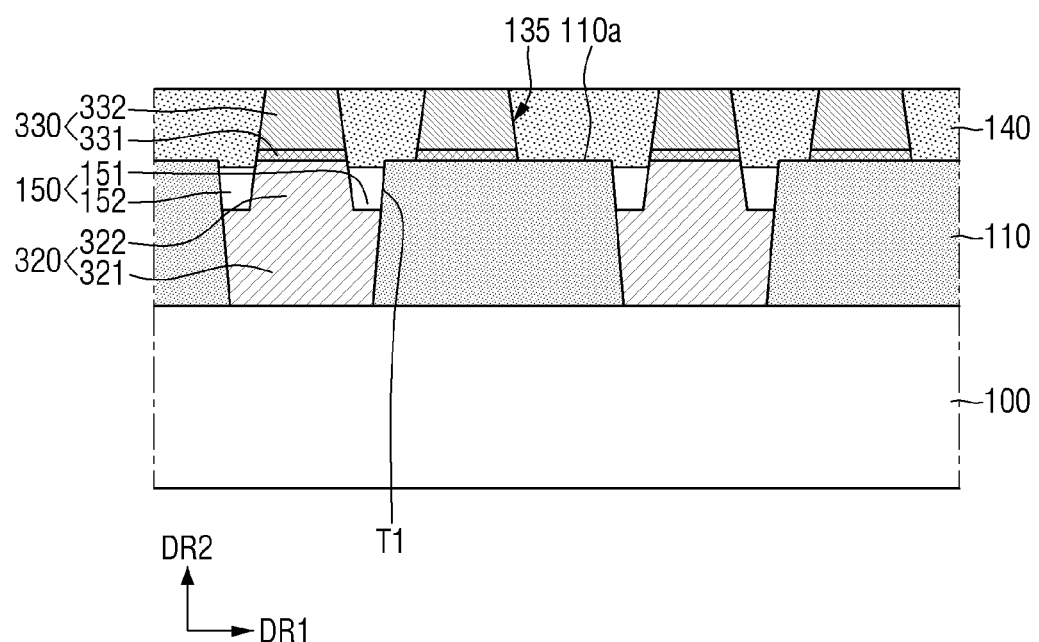

Referring to FIG. 21, the second interlayer insulating layer 140 may be formed on the first interlayer insulating layer 110. The second interlayer insulating layer 140 may surround a part of the side wall of the first wiring pattern 330 and the side wall of the second wiring pattern 135. For example, the second interlayer insulating layer 140 may surround a part of both side walls of the first wiring pattern 330 and both side walls of the second wiring pattern 135.

In this case, the air gap 150 may be formed inside the first trench T1 on both side walls of the second portion 322 of the contact plug 320. Specifically, the first air gap 151 may be formed inside the first trench T1 between the first side wall of the second portion 322 of the contact plug 320 and the first interlayer insulating layer 110. The second air gap 152 may be formed inside the first trench T1 between the second side wall of the second portion 322 of the contact plug 320 and the first interlayer insulating layer 110.

A part of the second interlayer insulating layer 140 may be formed inside the first trench T1. For example, the upper surface of the air gap 150 may be formed to be lower than the upper surface of the first interlayer insulating layer 110. However, the present disclosure is not limited thereto.

Figure 22:
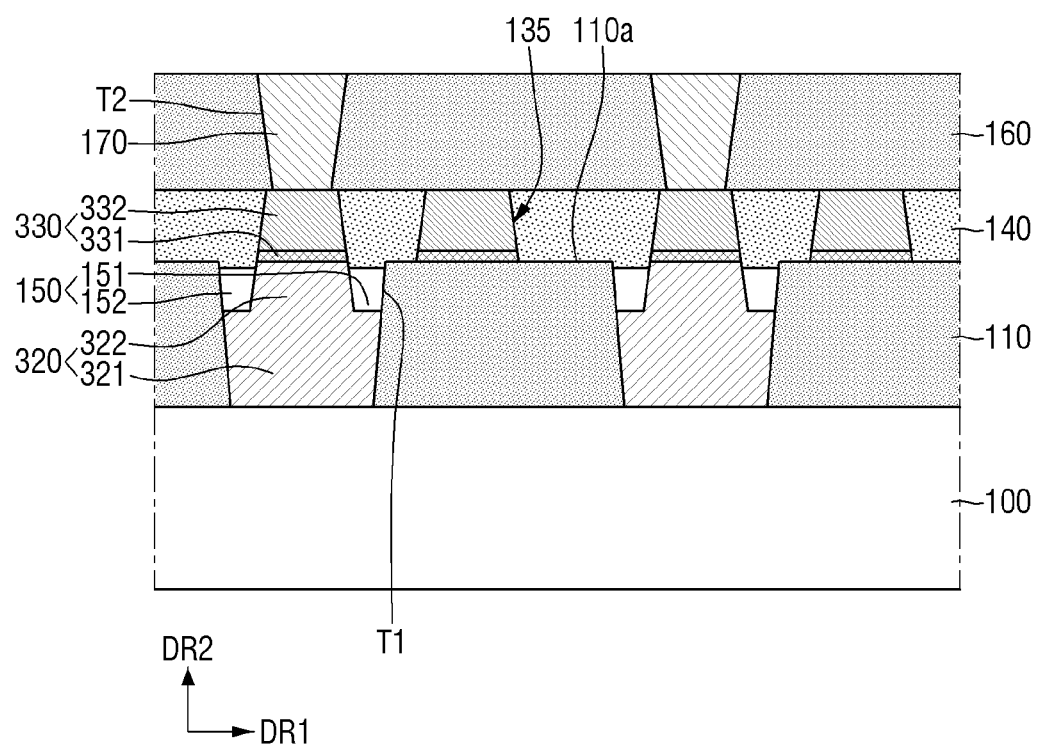

Referring to FIG. 22, the third interlayer insulating layer 160 may be formed on the second interlayer insulating layer 140. Subsequently, the second trench T2 extending in the vertical direction DR2 may be formed inside the third interlayer insulating layer 160. For example, the second trench T2 may expose a part of an upper surface of the first wiring pattern 330.

Subsequently, the via 170 may be formed inside the second trench T2. For example, the via 170 may completely fill the second trench T2.

Referring again to FIG. 4, the third wiring pattern 190 and the fourth wiring pattern 195 may be formed on the third interlayer insulating layer 160. For example, the third wiring pattern 190 and the fourth wiring pattern 195 may be formed through a patterning process. The width of each of the third wiring pattern 190 and the fourth wiring pattern 195 in the horizontal direction DR1 may increase toward the via 170 and the third interlayer insulating layer 160, respectively.

Subsequently, the fourth interlayer insulating layer 180 may be formed on the third interlayer insulating layer 160. The fourth interlayer insulating layer 180 may surround each of the side wall of the third wiring pattern 190 and the side wall of the fourth wiring pattern 195. For example, the fourth interlayer insulating layer 180 may surround both side walls of the third wiring pattern 190 and both side walls of the fourth wiring pattern 195.

In some other embodiments, the third wiring pattern 190 and the fourth wiring pattern 195 may also be formed by the damascene process. In this case, the width of each of the third wiring pattern 190 and the fourth wiring pattern 195 in the horizontal direction DR1 may decrease toward the via 170 and the third interlayer insulating layer 160, respectively.

In concluding the detailed description, those skilled in the art will appreciate that many variations and modifications may be made to the preferred embodiments without substantially departing from the principles of the present disclosure. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
    a substrate;
    a first interlayer insulating layer disposed on the substrate;
    a first trench formed inside the first interlayer insulating layer;
    a contact plug disposed inside the first trench, wherein an upper surface of the contact plug is lower than an upper surface of the first interlayer insulating layer;
    a first wiring pattern in contact with the contact plug, wherein at least a part of the first wiring pattern is disposed inside the first trench;
    a second wiring pattern which is disposed on the first interlayer insulating layer and spaced apart from the first wiring pattern in a horizontal direction; and
    a second interlayer insulating layer which is disposed on the first interlayer insulating layer and surrounds each of side walls of the first wiring pattern and each of side walls of the second wiring pattern,
    wherein side walls of the contact plug are in contact with the first interlayer insulating layer and at least one side wall of the first wiring pattern is spaced apart from the first interlayer insulating layer in the horizontal direction,
    wherein the first wiring pattern includes a first barrier layer contacting the upper surface of the contact plug,
    wherein the second wiring pattern includes a second barrier layer contacting the upper surface of the first interlayer insulating layer, and
    wherein the contact plug includes a third barrier layer disposed along the side walls and a bottom surface of the first trench, and a filling layer disposed on the third barrier layer.

2. The semiconductor device of claim 1, wherein side walls of the first wiring pattern are spaced apart from side walls of the first interlayer insulating layer in the horizontal direction.

3. The semiconductor device of claim 1, wherein one side wall of the first wiring pattern is spaced apart from a side wall of the first interlayer insulating layer in the horizontal direction and another side wall of the first wiring pattern is in contact with a side wall of the first interlayer insulating layer.

4. The semiconductor device of claim 1, wherein the first wiring pattern includes a wiring layer disposed on the first barrier layer.

5. The semiconductor device of claim 1, wherein the second wiring pattern is spaced apart from the first trench in the horizontal direction.

6. The semiconductor device of claim 1, wherein the second wiring pattern includes a wiring layer disposed on the second barrier layer.

7. The semiconductor device of claim 1, wherein an upper surface of the second interlayer insulating layer is formed on the same plane as each of an upper surface of the first wiring pattern and an upper surface of the second wiring pattern.

8. The semiconductor device of claim 1, further comprising:
- a third interlayer insulating layer disposed on the second interlayer insulating layer;
- a second trench formed inside the second interlayer insulating layer;
- a via disposed inside the second trench;
- a third wiring pattern disposed on the via;
- a fourth wiring pattern which is disposed on the third interlayer insulating layer and spaced apart from the third wiring pattern in the horizontal direction; and
- a fourth interlayer insulating layer which is disposed on the third interlayer insulating layer and surrounds each of side walls of the third wiring pattern and each of side walls of the fourth wiring pattern.

9. The semiconductor device of claim 1, wherein a width of the first wiring pattern in the horizontal direction increases toward the contact plug.

10. The semiconductor device of claim 1, wherein a width of the second wiring pattern in the horizontal direction increases toward the first interlayer insulating layer.

11. The semiconductor device of claim 1, wherein a height from the upper surface of the contact plug to an upper surface of the first interlayer insulating layer is greater than a pitch between the first trench and the second wiring pattern in the horizontal direction.

12. The semiconductor device of claim 1, wherein a height from an upper surface of the contact plug to an upper surface of the first interlayer insulating layer is greater than a pitch between the first trench and the second wiring pattern in the horizontal direction.

13. The semiconductor device of claim 1, wherein the first and second wiring patterns are formed in one patterning process.

* * * * *